United States Patent [19]
Otomo et al.

[11] Patent Number: 5,784,235
[45] Date of Patent: Jul. 21, 1998

[54] SEMICONDUCTOR IC DEVICE INCLUDING ESD PROTECTION CIRCUIT

[75] Inventors: Yusuke Otomo, Kawasaki; Takeshi Mizusawa, Isehara; Tetsuro Komatsu, Tokorozawa, all of Japan

[73] Assignee: Nippon Telegraph and Telephone Corporation, Japan

[21] Appl. No.: 658,827

[22] Filed: May 31, 1996

[30] Foreign Application Priority Data

| Jun. 2, 1995 | [JP] | Japan | 7-160033 |
| Nov. 16, 1995 | [JP] | Japan | 7-298737 |
| May 1, 1996 | [JP] | Japan | 8-134246 |

[51] Int. Cl.$^6$ .............................................. H02H 9/00
[52] U.S. Cl. ................... 361/56; 361/111; 361/118; 361/127
[58] Field of Search ................... 361/56, 91, 111, 361/118, 58, 127

[56] References Cited

U.S. PATENT DOCUMENTS

| 4,989,057 | 1/1991 | Lu | 357/23.7 |
| 5,321,293 | 6/1994 | Mojaradi et al. | 257/369 |
| 5,473,500 | 12/1995 | Payne et al. | 361/111 |

FOREIGN PATENT DOCUMENTS

| 62-287659 | 12/1987 | Japan | H01L 27/06 |
| 7335894 | 12/1995 | Japan | H01L 29/786 |

OTHER PUBLICATIONS

McGraw–Hill, 2nd. Ed., 1988, pp. 648–650, "VLSI Technology", edited by S. M. Sze.

X. Guggenmos et al, "A New ESD Protection Concept for VLSI CMOS Circuits Avoiding Circuit Stress", 1991 EOS/ESD Symposium Proceedings, pp. 74–82.

Mansun Chan et al, "ESD Reliability and Protection Schemes in SOI CMOS Output Buffers", IEEE Transactions on Electron Devices, vol. 42, No. 10, Oct. 1995, pp. 1816–1821.

*Primary Examiner*—Jeffrey A. Gaffin
*Assistant Examiner*—Stephen W. Jackson
*Attorney, Agent, or Firm*—Spencer & Frank

[57] ABSTRACT

A surge protection circuit including a first MOSFET and a second MOSFET connected in series. The drain of the first MOSFET is connected to the input terminal and the source of the second MOSFET is grounded. The gate of the second MOSFET is grounded, whereas the gate of the first MOSFET is connected to a high potential power supply terminal. This makes it possible to equalize the voltages applied to the two MOSFETs constituting the surge protection circuit, and weakens the intensity of the internal electric field of respective MOSFETs, thereby prolonging the lifetime of the surge protection circuit. The surge protection circuit is particularly effective in a SOI LSI.

17 Claims, 14 Drawing Sheets

VOLTAGES APPLIED TO MOSFETS WHEN
POTENTIAL OF PAD 10 IS 2Vdd-Vth

|  |  | CONVENTIONAL (SURGE PROTECTION CIRCUIT 20) | EMBODIMENT (SURGE PROTECTION CIRCUIT 30) |
|---|---|---|---|
| N-TYPE MOSFET 31 | Vgd | 2Vdd-Vthn (>Vdd) | Vdd-Vthn |
|  | Vds | 2Vdd-Vthn (>Vdd) | Vdd |
| N-TYPE MOSFET 32 | Vgd | 0 | Vdd-Vthn |
|  | Vds | 0 | Vdd-Vthn |

*FIG. 4*

IMPROVEMENT OF BREAKDOWN VOLTAGES OF
PROTECTION CIRCUITS IN ACCORDANCE WITH
THE EMBODIMENT (MEASURED VALUES)

|  | 2-STAGE MOSFET PROTECTION CIRCUIT OF THE EMBODIMENT | 1-STAGE MOSFET PROTECTION CIRCUIT OF PRIOR ART | IMPROVEMENT RATIO |
|---|---|---|---|
| 0.5 μm BULK CMOS | 8.4V | 7.8V | 1.1 |
| 0.5 μm SOI CMOS | 8.4V | 4.8V | 1.8 |

FIG.6

SEMICONDUCTOR IC DEVICE INCLUDING ESD PROTECTION CIRCUIT

BACKGROUND OF THE INVENTION

1. Field of the Invention

The present invention relates to a semiconductor IC (integrated circuit) device including a surge protection circuit for protecting the semiconductor IC device from overcurrent, and particularly to a semiconductor IC device including an ESD (electrostatic discharge) protection circuit suitable for a SOI (silicon on insulator) device.

2. Description of Related Art

Recently, with the development of mobile communications or the like, the demand is increasing for lower power consumption ICs. One promising methods which has been proposed reduces power consumption by reducing power supply voltages. It is impractical at present, however, to replace all the LSIs (Large Scale Integration ICs) in an apparatus by low power consumption LSIs from the viewpoint of cost, but it is effective to replace only LSIs with large power consumption. To achieve this, it is required to use a low supply voltage (2.0V, for example) LSI in combination with a high supply voltage (3.3V, for example) LSI. As a result, the low supply voltage LSI must be provided with interface circuits for accepting a high voltage input signal from a high supply voltage LSI, and for providing a high voltage output signal to its adjacent high supply voltage LSI.

On the other hand, the SOI technology, in which individual devices are formed on a thin film silicon layer on an insulated substrate, has been intensively studied recently as a method for implementing high speed, low power consumption devices because of its effectiveness for reducing parasitic capacitance and for keeping isolation between individual devices. The SOI devices, however, present the following two problems.

(1) Low ESD protection level

Generally speaking, ESD events can occur in LSIs during their handling such as during carriage and fabrication, and the ESD protection of commercially available LSIs is based on a MIL standard that regulates the ESD voltage. In particular, the ESD protection of SOI CMOSs is a matter of concern because of their structure in which a device layer is separated from a semiconductor substrate by a buried insulating layer with high thermal resistance. For example, M. Chan, et al. "ESD Reliability and Protection Scheme in SOI CMOS Output Buffers", IEEE Transactions on Electron Devices, VOL. 42, NO. 10, Oct. 1995 teaches that the ESD voltage sustained by SOI CMOS buffers is only about half the voltage sustained by bulk NMOS buffers. This constitutes one of the factors that prevent the industrialization of the SOI CMOS.

(2) Low drain breakdown voltage

SOI CMOS devices have a breakdown voltage lower than that of common bulk devices due to parasitic bipolar action. Accordingly, the MOSFETs constituting the SOI CMOS can be nearly broken down when the signal from a high supply voltage LSI is directly applied across the source and drain of these MOSFETs.

The above-described technical background presents a problem in determining what measures should be taken to realize, under the following conditions, highly reliable ESD protection of a SOI semiconductor device with low ESD protection voltage and low drain breakdown voltage. The conditions are that the ESD protection circuit must not break down for a high voltage input signal, but must immediately break down for surges during handling such as carriage of the chip. Since these two requirements are contradictory, it is difficult to realize a highly reliable ESD circuit.

The problem of the conventional surge protection circuit will be explained in more detail in view of the foregoing technical background. FIG. 1A shows a conventional semiconductor circuit device including a surge protection circuit which is described, for example, in S. M. Sze, "VLSI Technology", Second Edition, pp. 648–650, McGraw-Hill Book Company, 1988, or Japanese patent application laying-open No. 62-287659/1987.

The surge protection circuit 20 comprises NMOSFETs 21 and 22 connected in series, wherein the drain of the MOSFET 21 is connected to a pad 10, and the source of the MOSFET 22 is grounded. The gates of the MOSFETs 21 and 22 are both grounded. The pad 10 is connected to an internal circuit 12 through an input circuit 11. An output circuit may be connected instead of the input circuit 11.

The surge protection circuit 20 is in the OFF state in a normal operation mode, where the signal applied to the pad 10 is fed to the input circuit 11 without change. On the other hand, when a surge voltage is applied to the pad 10, both MOSFETs 21 and 22 break down to carry the overcurrent to the ground, thereby preventing an increase in the potential at the pad 10.

As described above, the conventional surge protection circuit 20 allows the input signal whose voltage is higher than a supply voltage Vdd. For example, a signal of 3.3V can be input to a circuit with a supply voltage Vdd=2.2V. Even in such a case, the surge protection circuit 20 must prevent itself from breaking down. In connection with this, the conventional surge protection circuit 20 has a problem in that the lifetime of the IC becomes shorter than that of a circuit which allows only an input signal of a voltage Vdd and less.

More specifically, when a voltage Vp higher than the supply voltage Vdd is applied to the pad 10, the higher voltage Vp is directly applied between the gate and drain of the MOSFET 21. As a result, the lifetime of the MOSFET 21 becomes shorter than that of the MOSFET 22, thereby decreasing the lifetime of the whole circuit.

FIG. 1B shows another example of a conventional surge protection circuit 40 based on FIG. 9 of X. Guggenmos, et al., "A NEW PROTECTION CONCEPT FOR VLSI CMOS CIRCUITS AVOIDING CIRCUIT STRESS", 1991 EOS/ESD SYMPOSIUM PROCEEDINGS. FIG. 1B shows only the surge protection circuit between the pad and the power supply terminal VDD.

This surge protection circuit includes a PMOSFET 41 with its source and gate connected to the power supply terminal VDD, and its drain connected to the pad 10. In surge protection circuit 40, the MOSFET 41 conducts when the level of the input signal to the pad 10 is higher than voltage Vdd+Vthp, where Vthp is the threshold voltage of the MOSFET 41. As a result, the input terminal is short-circuited with the power supply terminal VDD, thereby causing an overcurrent and an increase in heat. This might lead to damage of the surge protection circuit 40 due to the overcurrent, and even to damage of the LSI connected to the surge protection circuit.

SUMMARY OF THE INVENTION

It is therefore an object of the present invention to provide a long lifetime SOI ESD protection circuit which does not break down for a high input signal by equalizing the voltages across the gates and drains of the two MOSFETs connected in series in the surge protection circuit.

In a first aspect of the present invention, there is provided a semiconductor IC device having a first semiconductor circuit, a second semiconductor circuit, a signal input terminal, a signal output terminal, power supply terminals $V_{11}$ and $V_{21}$ of the first semiconductor circuit, and power supply terminals $V_{12}$ and $V_{22}$ of the second semiconductor circuit, the semiconductor IC device comprising:

a first surge protection circuit connected between the signal input terminal and the power supply terminal $V_{11}$;

a second surge protection circuit connected between the signal input terminal and the power supply terminal $V_{21}$;

a third surge protection circuit connected between the signal output terminal and the power supply terminal $V_{12}$;

a fourth surge protection circuit connected between the signal output terminal and the power supply terminal $V_{22}$;

wherein the first surge protection circuit comprises:

a first MOSFET whose drain is connected to the signal input terminal, and whose gate is connected to the power supply terminal $V_{21}$; and a second MOSFET whose drain is connected to a source of the first MOSFET, and whose source and gate are connected to the power supply terminal $V_{11}$;

wherein the second surge protection circuit comprises:

a third MOSFET whose source is connected to the power supply terminal $V_{21}$, and whose gate is connected to the power supply terminal $V_{22}$; and a fourth MOSFET whose source is connected to a drain of the third MOSFET, whose drain is connected to the signal input terminal, and whose gate is connected to the power supply terminal $V_{21}$;

wherein the third surge protection circuit comprises:

a fifth MOSFET whose drain is connected to the signal output terminal, and whose gate is connected to the power supply terminal $V_{21}$; and a sixth MOSFET whose drain is connected to a source of the fifth MOSFET, and whose source and gate are connected to the power supply terminal $V_{22}$;

and wherein the fourth surge protection circuit comprises:

a seventh MOSFET whose source and gate are connected to the power supply terminal $V_{12}$; and an eighth MOSFET whose source is connected to a drain of the seventh MOSFET, whose drain is connected to the signal output terminal, and whose gate is connected to the power supply terminal $V_{21}$.

Here, the semiconductor IC device may further comprise surge protection devices connected between the power supply terminals $V_{12}$ and $V_{21}$, and between the power supply terminals $V_{11}$ and $V_{22}$, respectively.

The semiconductor IC device may further comprise a first diode connected in parallel with the first surge protection circuit, a third diode connected in parallel with the third surge protection circuit, and a fourth diode connected in parallel with the fourth surge protection circuit.

The semiconductor IC device may be formed on a SOI LSI, in which respective elements of the semiconductor IC device are formed on a buried oxide formed on a substrate.

The first MOSFET and the second MOSFET may be formed on a first active silicon region formed on the buried oxide, the third MOSFET and the fourth MOSFET may be formed on a second active silicon region formed on the buried oxide, the fifth MOSFET and the sixth MOSFET may be formed on a third active silicon region formed on the buried oxide, and the seventh MOSFET and the eighth MOSFET may be formed on a fourth active silicon region formed on the buried oxide.

The semiconductor IC device may further comprise a first diode which is connected in parallel with the first surge protection circuit and formed in the first active silicon region, third diode which is connected in parallel with the third surge protection circuit and formed in the third active silicon region, and a fourth diode which is connected in parallel with the fourth surge protection circuit and formed in the fourth active silicon region.

A source of the first MOSFET may share a first diffusion layer formed in the first active silicon region with a drain of the second MOSFET, and a drain of the first MOSFET may share a second diffusion layer formed in the first active silicon region with a diffusion layer of the first diode, a source of the fourth MOSFET may share a third diffusion layer formed in the second active silicon region with a drain of the third MOSFET, and a drain of the fourth MOSFET may share a fourth diffusion layer formed in the second active silicon region with a diffusion layer of the second diode, a source of the fifth MOSFET may share a fifth diffusion layer formed in the third active silicon region with a drain of the sixth MOSFET, and a drain of the fifth MOSFET may share a sixth diffusion layer formed in the third active silicon region with a diffusion layer of the third diode, a source of the eighth MOSFET may share a seventh diffusion layer formed in the fourth active silicon region with a drain of the seventh MOSFET, and a drain of the eighth MOSFET may share an eighth diffusion layer formed in the fourth active silicon region with a diffusion layer of the fourth diode.

In a second aspect of the present invention, there is provided a surge protection circuit for a semiconductor IC device including a high potential power supply terminal VDD, a low potential power supply terminal GND, a semiconductor circuit connected between the power supply terminals VDD and GND, a signal input terminal of the semiconductor circuit, and a signal output terminal of the semiconductor circuit, the surge protection circuit comprising:

a first MOSFET whose drain is connected to the signal input terminal, and whose gate is connected to the power supply terminal VDD; and a second MOSFET whose drain is connected to a source of the first MOSFET, and whose source and gate are connected to the power supply terminal GND.

The surge protection circuit may be formed on a SOI LSI.

In a third aspect of the present invention, there is provided a surge protection circuit for a semiconductor IC device including a first high potential power supply terminal VDD to be connected to a first potential, a second high potential power supply terminal VDDO to be connected to a second potential higher than the first potential, a low potential power supply terminal GND to be connected to a third potential lower than the first potential, a semiconductor circuit connected between the low potential power supply terminal and at least one of the power supply terminals VDD and VDDO, a signal input terminal of the semiconductor circuit, and a signal output terminal of the semiconductor circuit, the surge protection circuit comprising:

a first MOSFET whose source is connected to the power supply terminal VDD, and whose gate is connected to the power supply terminal VDDO; and a second MOSFET whose source is connected to a drain of the first MOSFET, whose drain is connected to the input signal terminal, and whose gate is connected to the power supply terminal VDD.

The surge protection circuit may be formed on a SOI LSI.

In a fourth aspect of the present invention, there is provided a surge protection circuit for a semiconductor IC device including a high potential power supply terminal VDD, a low potential power supply terminal GNDO, a semiconductor circuit connected between the power supply terminals VDD and GNDO, a signal input terminal of the semiconductor circuit, and a signal output terminal of the semiconductor circuit, the surge protection circuit comprising:

- a first MOSFET whose drain is connected to the signal output terminal, and whose gate is connected to the power supply terminal VDD; and
- a second MOSFET whose drain is connected to a source of the first MOSFET, and whose source and gate are connected to the power supply terminal GNDO.

The surge protection circuit may be formed on a SOI LSI.

In a fifth aspect of the present invention, there is provided a surge protection circuit for a semiconductor IC device including a first high potential power supply terminal VDD to be connected to a first potential, a second high potential power supply terminal VDDO to be connected to a second potential higher than the first potential, a low potential power supply terminal GND to be connected to a third potential lower than the first potential, a semiconductor circuit connected between the low potential power supply terminal and at least one of the power supply terminals VDD and VDDO, a signal input terminal of the semiconductor circuit, and a signal output terminal of the semiconductor circuit, the surge protection circuit comprising:

- a first MOSFET whose source is connected to the power supply terminal VDD, and whose gate is connected to the power supply terminal VDDO; and
- a second MOSFET whose source is connected to a drain of the first MOSFET, whose drain is connected to the output signal terminal, and whose gate is connected to the power supply terminal VDD.

The surge protection circuit may be formed on a SOI LSI.

In a sixth aspect of the present invention, there is provided a semiconductor IC device having n semiconductor circuit $A_i$ (i=1, 2, . . . n), a signal input terminal, a signal output terminal, and power supply terminals $V_{1i}$ and $V_{2i}$ of each of the semiconductor circuits $A_i$, the semiconductor IC device comprising:

- a first surge protection circuit connected between the signal input terminal and the power supply terminal $V_{11}$;
- a second surge protection circuit connected between the signal input terminal and the power supply terminal $V_{21}$;
- a third surge protection circuit connected between the signal output terminal and the power supply terminal $V_{1n}$;
- a fourth surge protection circuit connected between the signal output terminal and the power supply terminal $V_{2n}$; and
- surge protection devices $P_{ik}$ connected between the power supply terminal $V_{1i}$ and power supply terminals $V_{2k}$ (k=1–n, and k≠i) other than a power supply terminal $V_{2i}$.

The semiconductor IC device may further comprise surge protection devices $P_{ii}$ connected between the power supply terminals $V_{1i}$ and $V_{2i}$.

The surge protection circuit in accordance with the present invention comprises two MOSFETs connected in series, and the gate of the first MOSFET is connected to the higher potential power supply. This makes it possible to limit the gate-drain voltage of the first MOSFET to within the supply voltage even if a voltage higher than the higher potential voltage is supplied to the pad. This in turn weakens the intensity of the internal electric field of the first MOSFET, resulting in a longer lifetime surge protection circuit.

The above and other objects, effects, features and advantages of the present invention will become more apparent from the following description of the embodiments thereof taken in conjunction with the accompanying drawings.

BRIEF DESCRIPTION OF THE DRAWINGS

FIG. 4 is a table showing voltages applied to the two MOSFETs constituting the surge protection circuit when the voltage applied to the pad is 2Vdd–Vthn, and making a comparison between the first embodiment and the conventional circuit;

FIG. 6 is a table showing the measured results of the breakdown voltages (snapback voltages) of 0.5 μm CMOS MOSFETs, wherein a comparison is made between the first embodiment and the conventional circuit;

DETAILED DESCRIPTION OF PREFERRED EMBODIMENTS

The invention will now be described with reference to the accompanying drawings. In the following description, it is assumed that the reliability of respective MOSFETs constituting a semiconductor IC device is guaranteed under the condition that they are used with the rated supply voltage.

EMBODIMENT 1

Figure 1A:
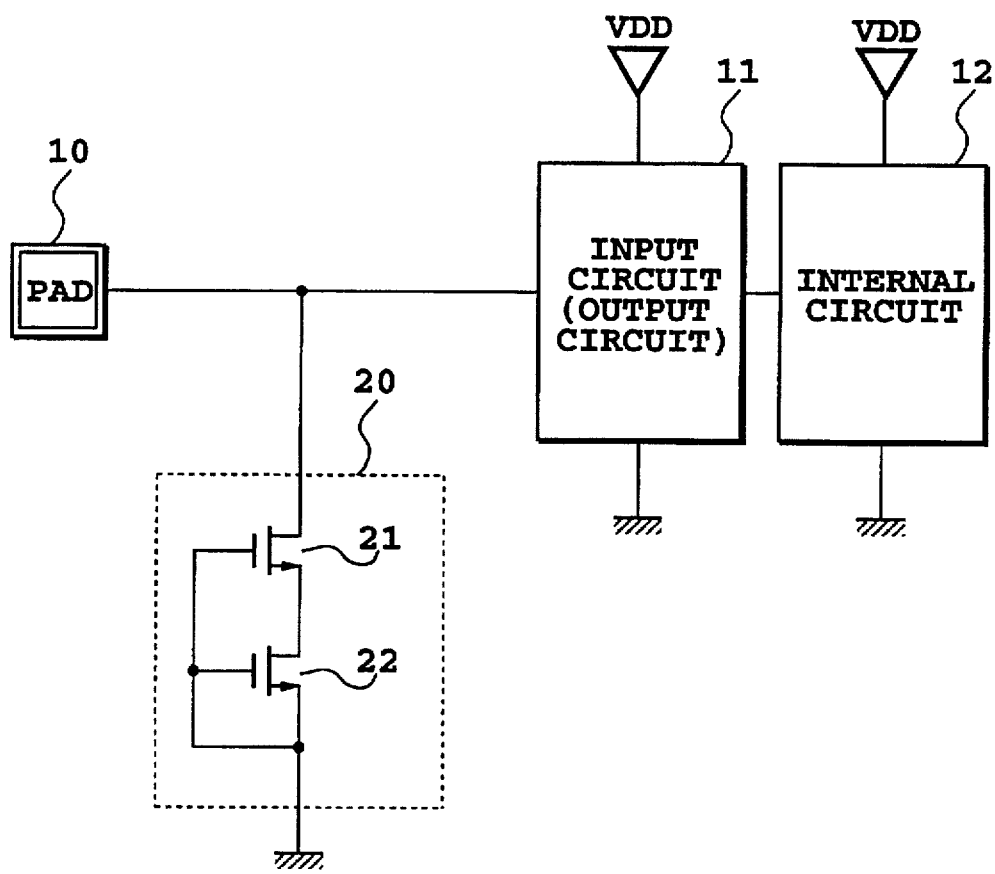
FIGS. 1A and 1B are block diagrams showing conventional semiconductor IC devices with a surge protection circuit.
Figure 1B:
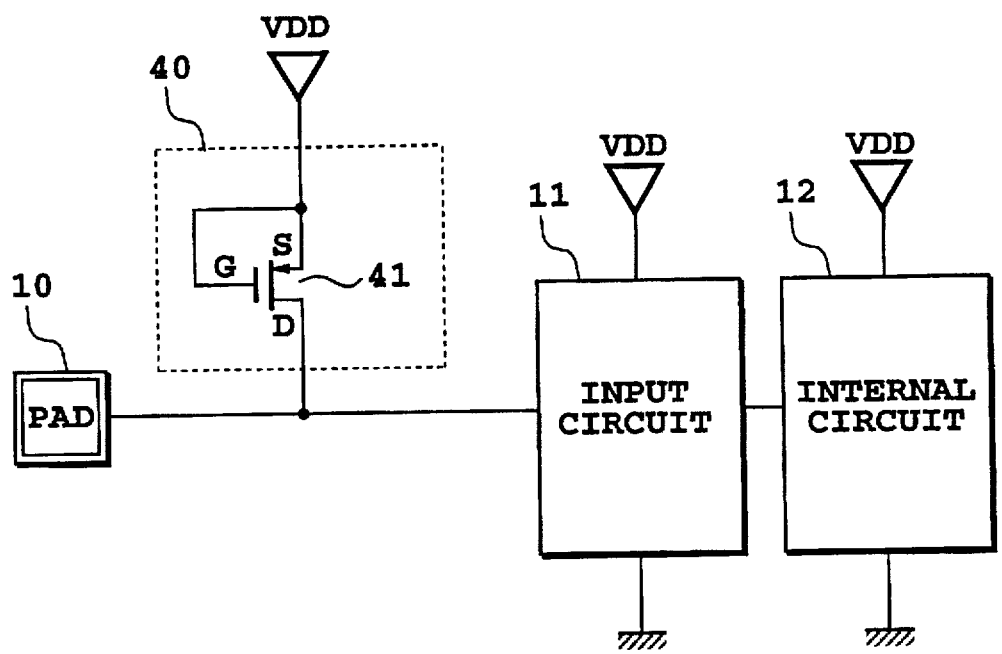
Figure 2:
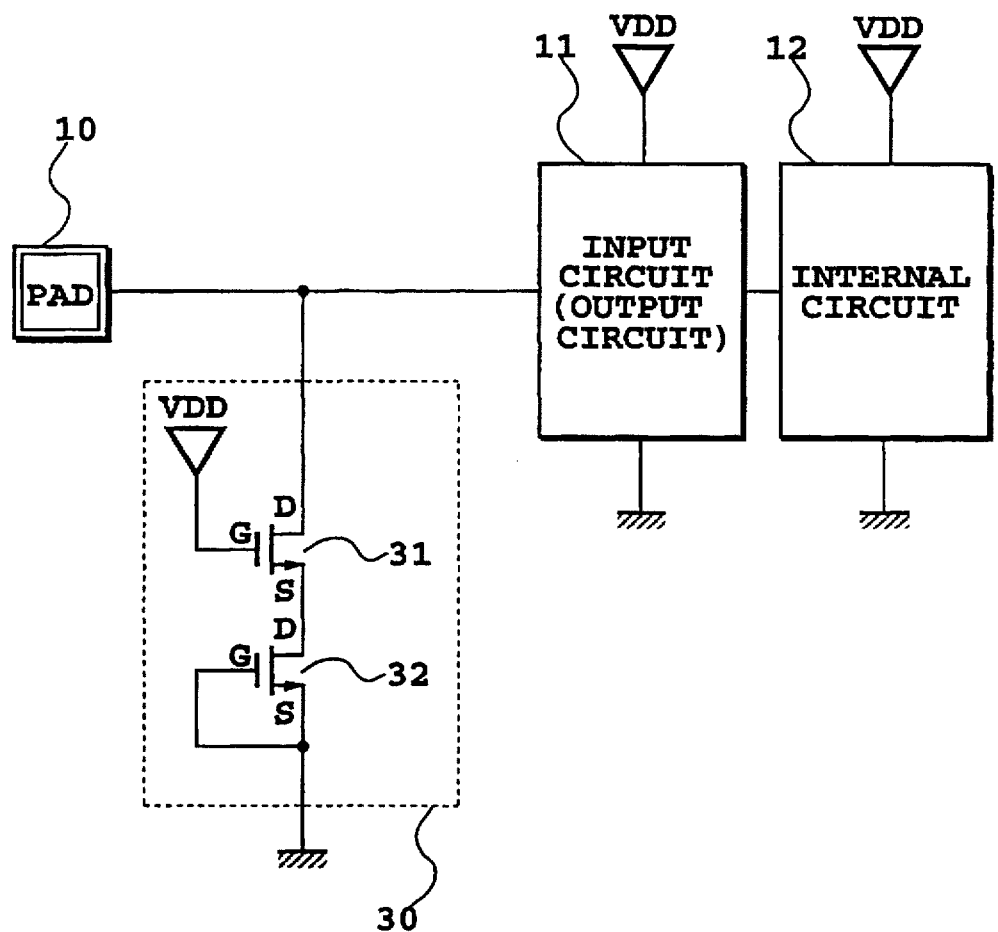
FIG. 2 is a block diagram showing a first embodiment of a semiconductor IC device with an ESD protection circuit in accordance with the present invention.

FIG. 2 is a block diagram showing a first embodiment of a semiconductor IC device with an ESD protection circuit in accordance with the present invention.

In FIG. 2, a surge protection circuit 30 includes MOSFETs 31 and 32 connected in series. The drain of the MOSFET 31 is connected to a pad 10, the source of the MOSFET 31 is connected to the drain of the MOSFET 32, and the source of the MOSFET 32 is grounded. The gate of the MOSFET 31 is connected to a higher potential supply voltage Vdd, and the gate of the MOSFET 32 is grounded. The surge protection circuit 30 of this embodiment differs from the conventional surge protection circuit 20 in that the gate of the MOSFET 31 is not grounded, but connected to the higher potential supply voltage Vdd.

The operation of this embodiment will now be described. The operation of the semiconductor IC device falls into a common operation mode in which the device operates normally with its power supplied, and a protection mode in which the input circuit 11 and internal circuit 12 are protected during handling such as during carriage or wire bonding of the chip. The operation will be described under these headings.

1. The operation in the normal mode.

Figure 3:
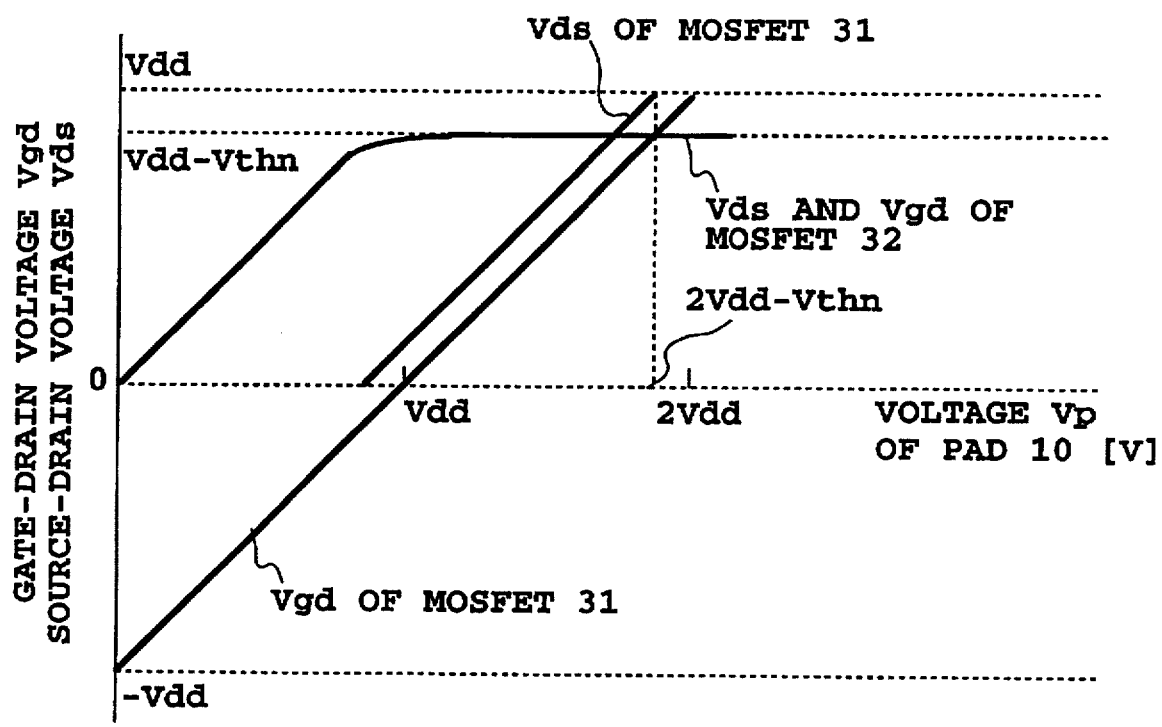
FIG. 3 is a graph illustrating voltages applied to the two MOSFETs constituting the surge protection circuit of the first embodiment, when the pad voltage varies.

FIG. 3 is a graph illustrating voltages applied to the MOSFETs 31 and 32 when the semiconductor IC device is under operation. The axis of abscissas represents the voltage Vp applied to the pad 10, and the axis of ordinates represents the gate-drain voltages Vgd and source-drain voltages Vds of the MOSFETs 31 and 32.

Since the gate voltage of the MOSFET 31 is kept constant at Vdd, its gate-drain voltage Vgd=Vp−Vdd.

The MOSFET 31 keeps the ON state until the pad voltage Vp reaches Vdd−Vthn from 0, where Vthn is the threshold voltage of the MOSFET 31. Accordingly, the source-drain voltage Vds of the MOSFET 31 in this range is kept zero. As the pad voltage Vp increases beyond Vdd−Vthn, the source-drain voltage Vds increases in accordance with Vds=Vp−(Vdd−Vthn), and becomes Vds=Vdd when the pad voltage Vp=2Vdd−Vthn.

On the other hand, the source-drain voltage Vds of the MOSFET 32 is kept at Vds=Vp as long as the MOSFET 31 is in the ON state, that is, until the pad voltage reaches Vp=Vdd−Vthn. Beyond this voltage of MOSFET 32, the source-drain voltage is kept at Vds=Vdd−Vthn. Thus, the voltages of respective terminals of the MOSFETs 31 and 32 are kept within Vdd up to the pad voltage Vp=2Vdd−Vthn.

FIG. 4 is a table showing the gate-drain voltage Vgd and source-drain voltage Vds of the MOSFETs 31 and 32 of the embodiment in comparison with the conventional example. As shown in this table, the voltages of the MOSFETs 31 and 32 fall within Vdd. Thus, uniform internal electric fields are built in the MOSFETs 31 and 32, which makes it possible to prolong the lifetime of the MOSFETs.

2. Operation in surge protection.

The individual elements of the semiconductor IC device are in the floating state during the transport or wire bonding of the chip. More precisely, the higher potential power supply terminal is connected to the ground through OFF resistances of the MOSFETs of the internal circuit 12. Therefore, the gate of the MOSFET 31 can be considered to be grounded through a high resistor.

Figure 5:
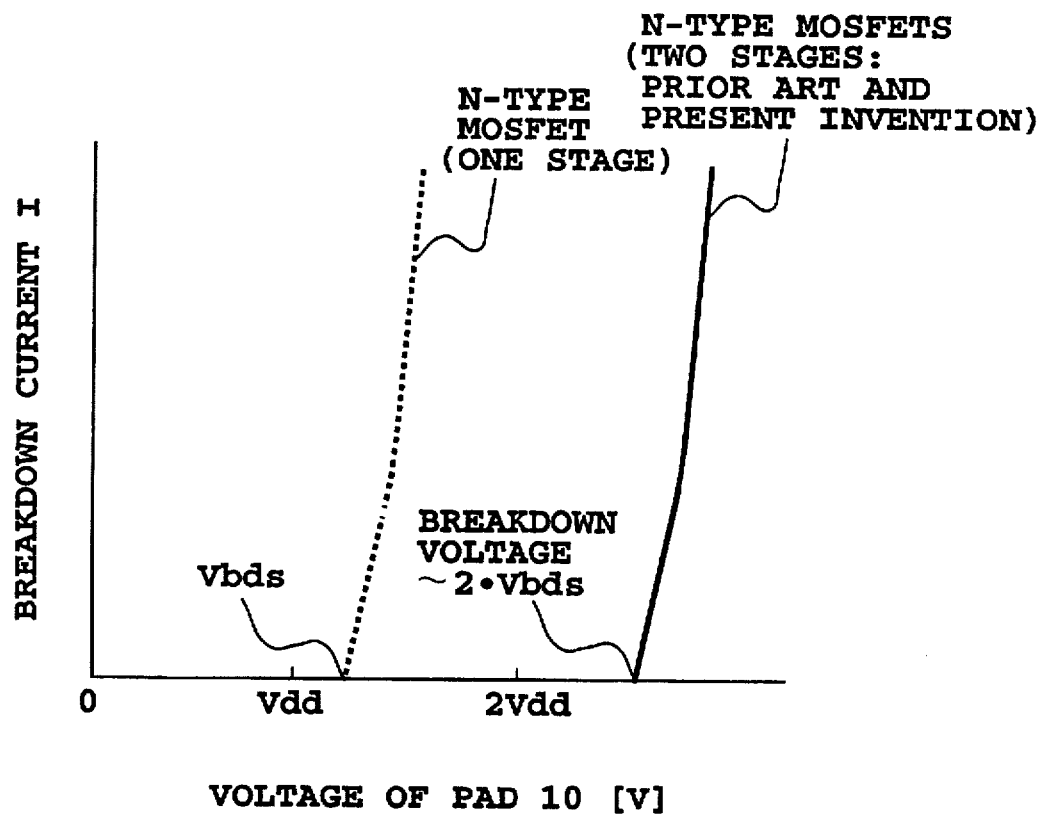
FIG. 5 is a graph illustrating the relationships between the input voltage to the pad, and the breakdown voltage and current in the first embodiment.

Assuming that the source-drain breakdown voltage of the MOSFET is Vbds, that of the MOSFETs 31 and 32 also becomes Vbds. As a result, the breakdown voltage of the surge protection circuit 30 is nVbds as shown in FIG. 5, where n is present in a range of about 1.1–2.0. Thus, it is possible to set nVbds>Vdd.

If a surge is applied to the pad 10, both the MOSFETs 31 and 32 break down, allowing the overcurrent to flow to the ground, thereby limiting an increase in the potential at the pad 10. This prevents the application of the overvoltage and the inflow of the overcurrent to the input circuit 11, thereby preventing damage of the MOSFETs in the circuit. The operation during the surge protection is similar to that of the conventional device.

FIG. 6 is a table showing measured results of the breakdown voltages of 0.5 μm CMOS's in accordance with the present invention in comparison with the conventional circuits. When applying the present invention to a bulk circuit, the voltage applicable to the pad 10 becomes 1.1 times that of the conventional circuit consisting of one stage NMOSFET. On the other hand, when the present invention is applied to a SOI circuit, it becomes 1.8 times that of the conventional circuit. Thus, the surge protection circuit in accordance with the present invention is more effective when it is applied to the SOI LSI.

EMBODIMENT 2

Figure 7:
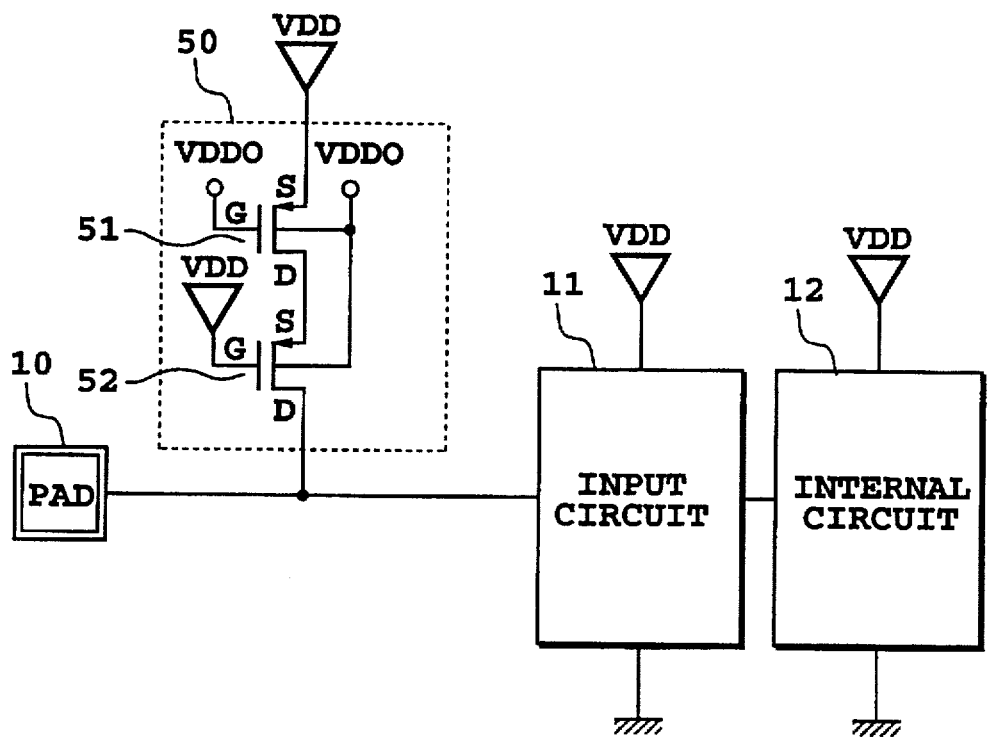
FIG. 7 is a block diagram showing a second embodiment of the semiconductor IC device with the ESD protection circuit in accordance with the present invention.

FIG. 7 is a block diagram showing a second embodiment of the semiconductor IC device with the surge protection circuit in accordance with the present invention. The semiconductor IC device uses a first high potential power supply voltage Vdd and a second high potential power supply voltage Vddo which is higher than Vdd.

In FIG. 7, a surge protection circuit 50 includes PMOSFETs 51 and 52 connected in series. The source of the MOSFET 51 is connected to the power supply terminal VDD, and its drain is connected to the source of the MOSFET 52. The drain of the MOSFET 52 is connected to the pad 10. The gate of the MOSFET 51 is connected to the second high potential power supply terminal VDDO, and the gate of the MOSFET 52 is connected to the first high potential power supply terminal VDD. It is a feature of the surge protection circuit 50 of the present embodiment that the gates of the MOSFETs 51 and 52 are each connected to the high potential supply voltages.

The operation of this embodiment will now be described under the headings of the common operation mode and the surge protection mode.

1. Common operation mode.

Figure 8:
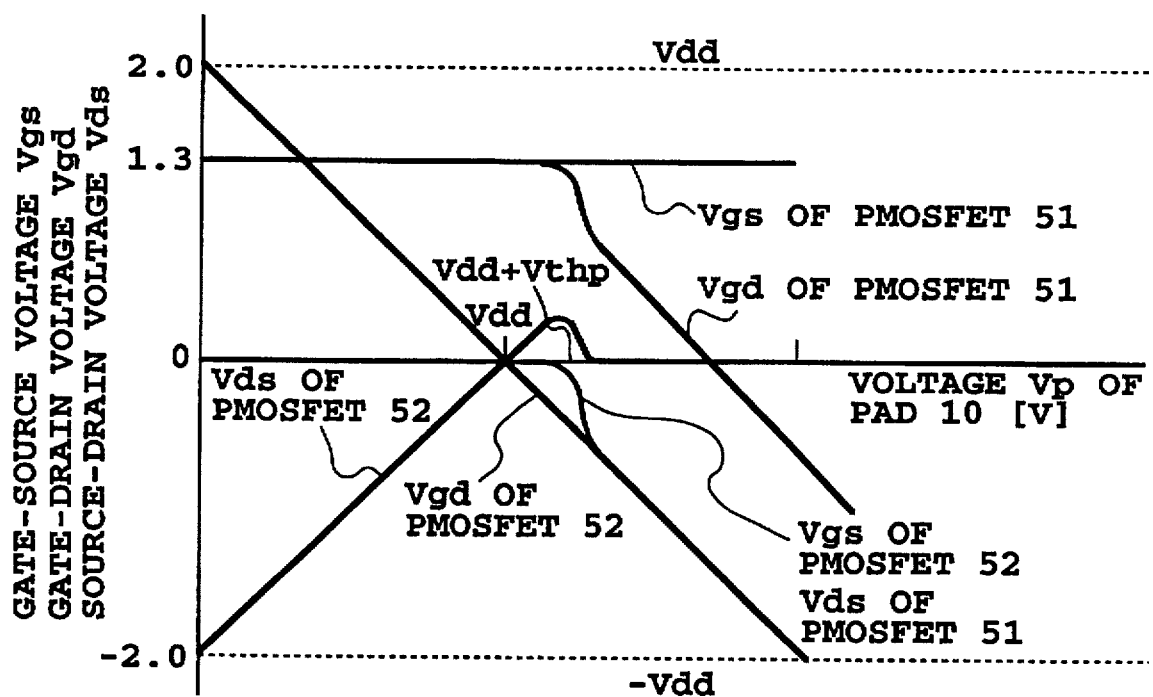
FIG. 8 is a graph illustrating voltages applied to the two MOSFETs constituting the surge protection circuit of the second embodiment, when the pad voltage varies.

FIG. 8 is a graph illustrating voltages applied to the MOSFETs 51 and 52 during the operation of the semiconductor IC device, where the axis of abscissas represents the applied voltage Vp to the pad 10, and the axis of ordinates represents the gate-source voltage Vgs, gate-drain voltage Vgd and source-drain voltage Vds of the MOSFETs 51 and 52. The operation of the embodiment will be described with reference to this graph.

(1) When the pad voltage Vp is from zero to Vdd+Vthp.

Assuming that the threshold voltage of the PMOSFET 52 is Vthp, the MOSFET 52 keeps the OFF state while the pad voltage Vp is from zero to Vdd+Vthp. Accordingly, the source potential of the MOSFET 52 equals the gate potential Vdd. In other words, the gate-source voltage of the MOSFET 52 Vgs=0. As the pad voltage Vp increases in this range, the source-drain voltage Vds of the MOSFET 52 increases in accordance with Vds=Vp−Vdd, and becomes zero when Vp=Vdd. At the same time, the gate-drain voltage Vgd of the MOSFET 52 decreases as Vgd=Vdd−Vp, reaching zero when Vp=Vdd.

On the other hand, voltages associated with the MOSFET 51 are as follows: First, the gate-source voltage Vgs of the MOSFET 51 is kept constant at Vgs=Vddo−Vdd because the gate voltage of the MOSFET 51 is fixed at Vddo. As mentioned above, since the drain potential of the MOSFET 51 is Vdd, its gate-drain voltage Vgd=Vddo−Vdd, and its source-drain voltage Vds is kept zero.

In summary, the voltages of the respective electrodes of the MOSFETs 51 and 52 are kept within the first high potential supply voltage Vdd. As a result, the MOSFETs 51 and 52 do not break down. That is, the surge protection circuit 50 does not break down in this range.

(2) When the pad voltage Vp exceeds Vdd+Vthp.

When the pad voltage Vp increases beyond Vdd+Vthp, the MOSFET 52 conducts, and its source potential becomes equal to the pad voltage Vp. In this case, the source-drain voltage Vds, gate-source voltage Vgs and gate-drain voltage Vgd of the MOSFET 52 are Vds=0, Vgs=Vdd−Vp, and Vgd=Vdd−Vp, respectively.

With regard to the MOSFET 51, its drain potential equals the pad voltage Vp. Accordingly, its source-drain voltage Vds=Vp−Vdd, gate-drain voltage Vgd=Vddo−Vp. The gate-source voltage Vgs is kept constant at Vgs=Vddo−Vdd.

Thus, the voltages of the respective terminals of the MOSFETs 51 and 52 are restricted within Vdd as long as the pad voltage Vp is within 2Vdd. However, since the gate-drain voltage Vgd of the MOSFET 51 is expressed as Vgd=Vddo−Vp, the MOSFET 51 will conduct when the pad voltage Vp exceeds Vddo+Vthp. Therefore, the upper limit of the application range of the surge protection circuit in accordance with the embodiment is Vddo+Vthp, which is higher than the higher potential supply voltage Vddo.

2. Surge protecting operation.

During handling such as carriage or wire bonding of the chip, its respective elements are in the floating state because no power is supplied. More precisely, the power supply terminals are grounded through OFF resistances of the MOSFETs in the internal circuit 12. Accordingly, the gate of the MOSFET 52 is also grounded through a high resistance.

When a negative surge is applied to the pad 10, both the MOSFETs 51 and 52 break down, allowing the overcurrent to flow to the power supply terminal VDD, thereby limiting an increase of the potential of the pad 10. This prevents the application of the overvoltage and inflow of the overcurrent to the input circuit 11, thereby preventing the damage of the internal MOSFETS.

On the other hand, when a positive surge is applied to the pad 10, the MOSFETs 51 and 52 conduct, allowing the overcurrent to flow to the power supply terminal VDD, thereby limiting the increase of the pad potential. This prevents the application of the overvoltage and inflow of the overcurrent to the input circuit 11, thereby preventing the damage of the internal MOSFETs.

Figure 9:
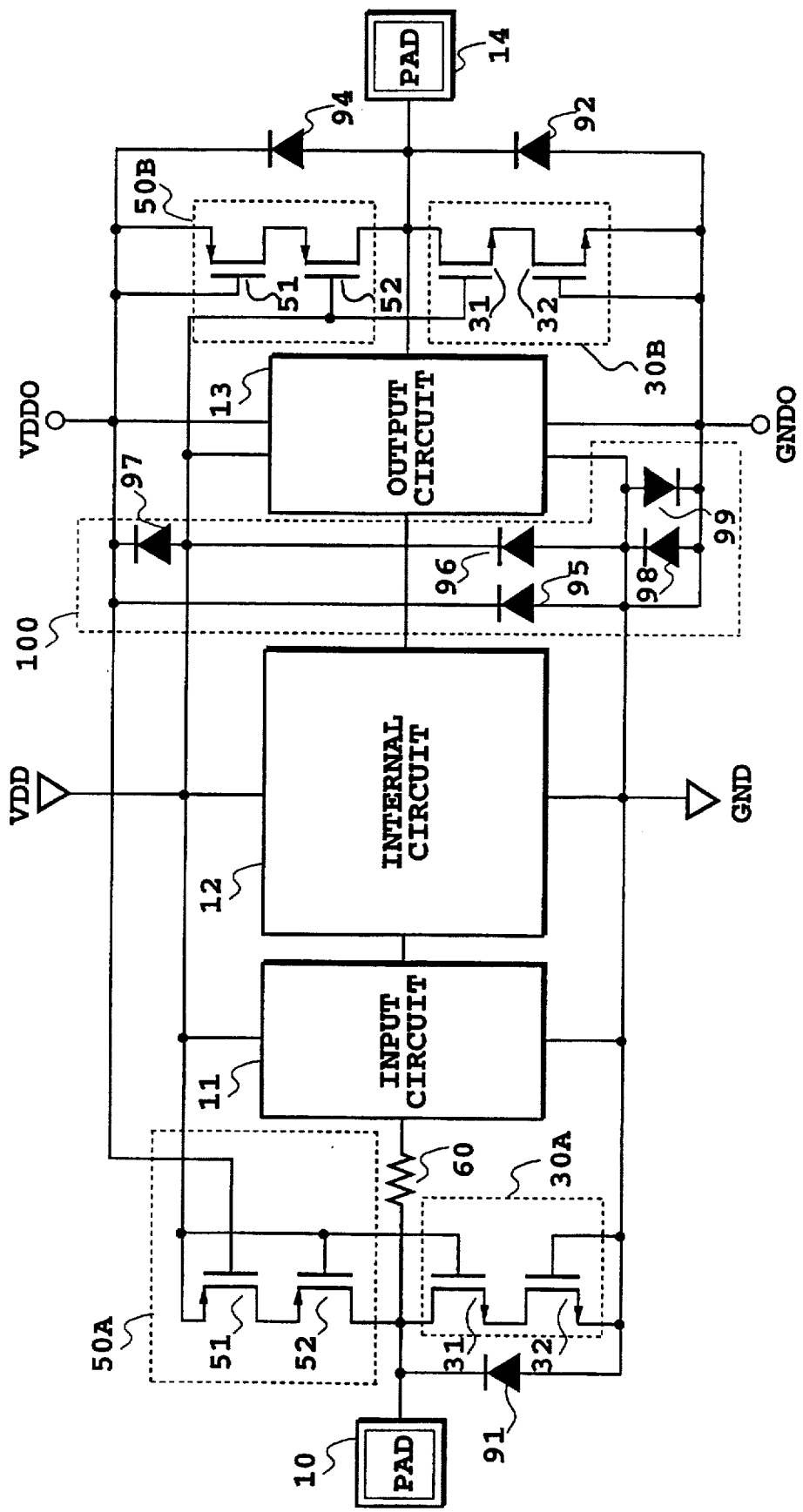
FIG. 9 is a block diagram showing a third embodiment of the semiconductor IC device with the ESD protection circuit in accordance with the present invention.

The foregoing is an explanation when a surge voltage is applied across the pad 10 and the power supply terminal VDD. The surge voltage, however, can be applied across the pad 10 and the power supply terminal VDDO. To handle such a surge voltage, a MOS diode should be connected between the power supply terminals VDD and VDDO as shown in FIG. 9 of the next embodiment (see, FIG. 9, reference numeral 97). This will make it possible to cause the surge applied across the pad 10 and the power supply terminal VDDO to flow through the pad 10, surge protection circuit 50 and the power supply terminal VDD.

EMBODIMENT 3

FIG. 9 is a block diagram showing a third embodiment of a semiconductor IC device including a surge protection circuit in accordance with the present invention.

In this figure, the internal circuit 12 is connected not only to the pad 10 through the input circuit 11, but also to a pad 14 through an output circuit 13. Respective power supply terminals of the input circuit 11, internal circuit 12 and the output circuit 13 are connected to the first high potential power supply terminal VDD and the ground GND as shown in FIG. 9. Other power supply terminals of the output circuit 13 are connected to the second high potential power supply terminal VDDO and a ground GNDO.

In addition, the surge protection circuit 30 of the first embodiment is connected between the pad 10 and the ground GND as a surge protection circuit 30A, and between the pad 14 and the ground GNDO as a surge protection circuit 30B. Likewise, the surge protection circuit 50 of the second embodiment is connected between the pad 10 and the first high potential power supply terminal VDD as a surge protection circuit 50A, and between the pad 14 and the second high potential power supply terminal VDDO as a surge protection circuit 50B.

The surge protection circuits 30A, 30B and 50B are provided with lateral diodes 91, 92 and 94, which are connected in parallel with them, respectively. In addition, diodes are connected between power supply lines. Specifically, diodes 95–99 are connected between the two power supply terminals VDD and VDDO and the two ground terminals GND and GNDO. These diodes will allow a surge to flow when they are forward biased by the surge, thereby preventing the overcurrent and overvoltage.

Next, the operation of this embodiment will be described under the headings of "operation during normal operation of the LSI", and "operation during handling of the LSI".

1. Operation during normal operation of the LSI.

The operation of the individual surge protection circuits 30A, 30B, 50A and 50B have already been described in the first and second embodiments. As described above, the voltages applied to the MOSFETs 31, 32, 51 and 52 of the respective surge protection circuits are kept within Vdd. This makes it possible to prolong the lifetime of the surge protection circuits.

2. Operation during handling of the LSI.

To protect the LSI from ESD, the surge protection circuits must have surge-proof characteristics for the following 16 surge paths. Low resistance surge current paths will be described below for each of the 16 cases.

(1) When the positive ESD event occurs at the input pad 10, and the surge current flows to the power supply terminal VDD.

The PMOSFETs 51 and 52, of the surge protection circuit 50A conduct to discharge the surge.

(2) When the negative ESD event occurs at the input pad 10, and the surge current flows from the power supply terminal VDD.

The PMOSFETs 51 and 52 of the surge protection circuit 50A break down to discharge the surge. Alternatively, the diode 96 or the internal circuit 12 breaks down to discharge the surge through the diode 91 or the surge protection circuit 30A.

(3) When the positive ESD event occurs at the input pad 10, and the surge current flows to the power supply terminal VDDO.

The PMOSFETs 51 and 52 of the surge protection circuit 50A conduct to discharge the surge through the diode 97.

(4) When the negative ESD event occurs at the input pad 10, and the surge current flows from the power supply terminal VDDO.

The diode 95 breaks down to discharge the surge through the diode 98, and through the diode 91 or the surge protection circuit 30A.

(5) When the positive ESD event occurs at the input pad 10, and the surge current flows to the ground terminal GND.

The surge is discharged through the surge protection circuit 30A. Alternatively, it is discharged through the surge protection circuit 50A, and the internal circuit 12 or the diode 96, which is broken down.

(6) When the negative ESD event occurs at the input pad 10, and the surge current flows from the ground terminal GND.

The surge is discharged through the diode 91 which is forward biased by the surge.

(7) When the positive ESD event occurs at the input pad 10, and the surge current flows to the ground terminal GNDO.

The surge is discharged through the surge protection circuit 30A and the diode 99. Alternatively, it is discharged through the surge protection circuit 50A, the internal circuit 12 or the diode 96, which is broken down, and the diode 99.

(8) When the negative ESD event occurs at the input pad 10, and the surge current flows from the ground terminal GNDO.

The surge is discharged through the diodes 98 and 91 which are forward biased by the surge.

(9) When the positive ESD event occurs at the input pad 14, and the surge current flows to the power supply terminal VDDO.

The PMOSFETs 51 and 52 of the surge protection circuit 50B conduct to discharge the surge.

(10) When the negative ESD event occurs at the input pad 14, and the surge current flows from the power supply terminal VDDO.

The surge is discharged through the surge protection circuit 50B or the diode 94, which is broken down.

(11) When the positive ESD event occurs at the input pad 14, and the surge current flows to the power supply terminal VDD.

The surge is discharged through the diode 94 which is forward biased by the surge, and the diode 97 which is broken down.

(12) When the negative ESD event occurs at the input pad 14, and the surge current flows from the power supply terminal VDD.

The surge is discharged through the diode 97 which is forward biased, and the diode 94 which is broken down by the surge.

(13) When the positive ESD event occurs at the input pad 14, and the surge current flows to the ground terminal GNDO.

The surge is discharged through the surge protection circuit 30B.

(14) When the negative ESD event occurs at the input pad 14, and the surge current flows from the ground terminal GNDO.

The surge is discharged through the diode 92 which is forward biased by the surge.

(15) When the positive ESD event occurs at the input pad 14, and the surge current flows to the ground terminal GND.

The surge is discharged through the surge protection circuit 30B and the diode 98. Alternatively, it is discharged through the diode 94 and the internal circuit 12 which is broken down.

(16) When the negative ESD event occurs at the input pad 14, and the surge current flows from the ground terminal GND.

Figure 10:
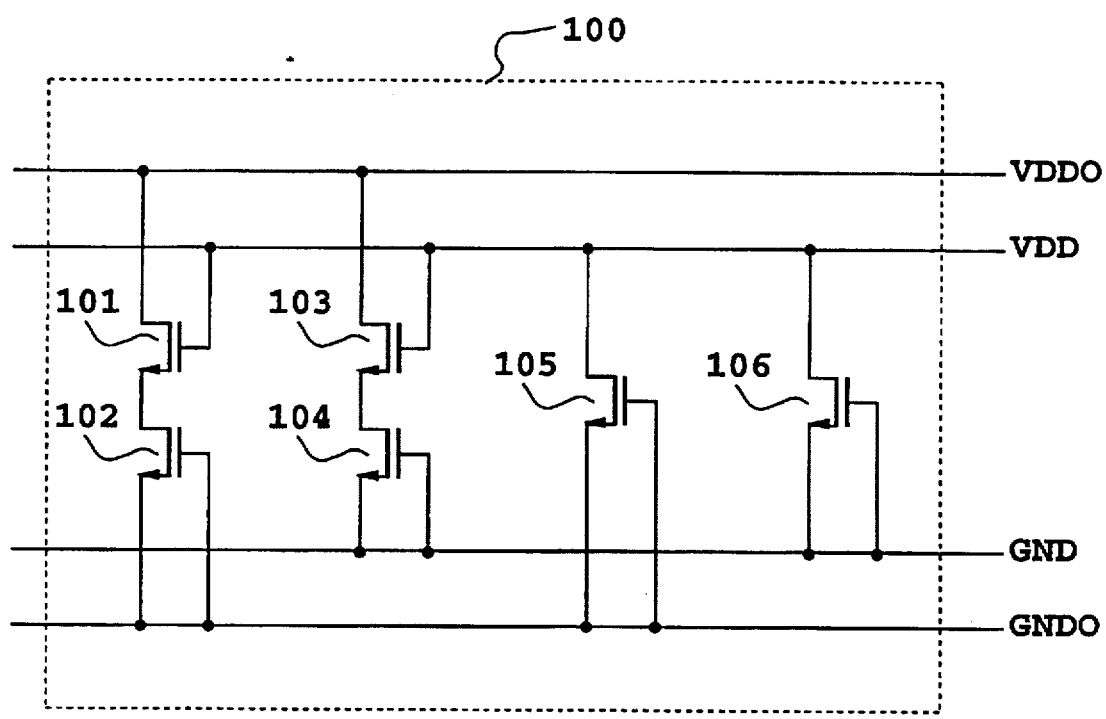
FIG. 10 is a circuit diagram showing an arrangement of an alternative MOS circuit to the circuit 100 of the third embodiment.

The surge is discharged through the diodes 99 and 92 which are forward biased by the surge. Thus, the ESD-proof circuit can be implemented for the entire terminals of the LSI, and for the positive and negative surge. This makes it possible to positively protect the input circuit 11, internal circuit 12 and output circuit 13 from all types of surges. Incidentally, it is a well-known fact that even if a surge current flows through the internal circuit 12, it does not suffer any immediate failure or the slightest damage, thereby presenting no problem about reliability, because the surge current is distributed to many gates in the circuit 12. Furthermore, the diodes 96–99 are not restricted to lateral diodes, but can be replaced with MOS diodes. Moreover, a circuit 100 consisting of the diodes 95–99 can be replaced with a MOS circuit consisting of the MOSFETs 101–106 as shown in FIG. 10 without losing the effect and advantages of the circuit of FIG. 9.

Figure 11:
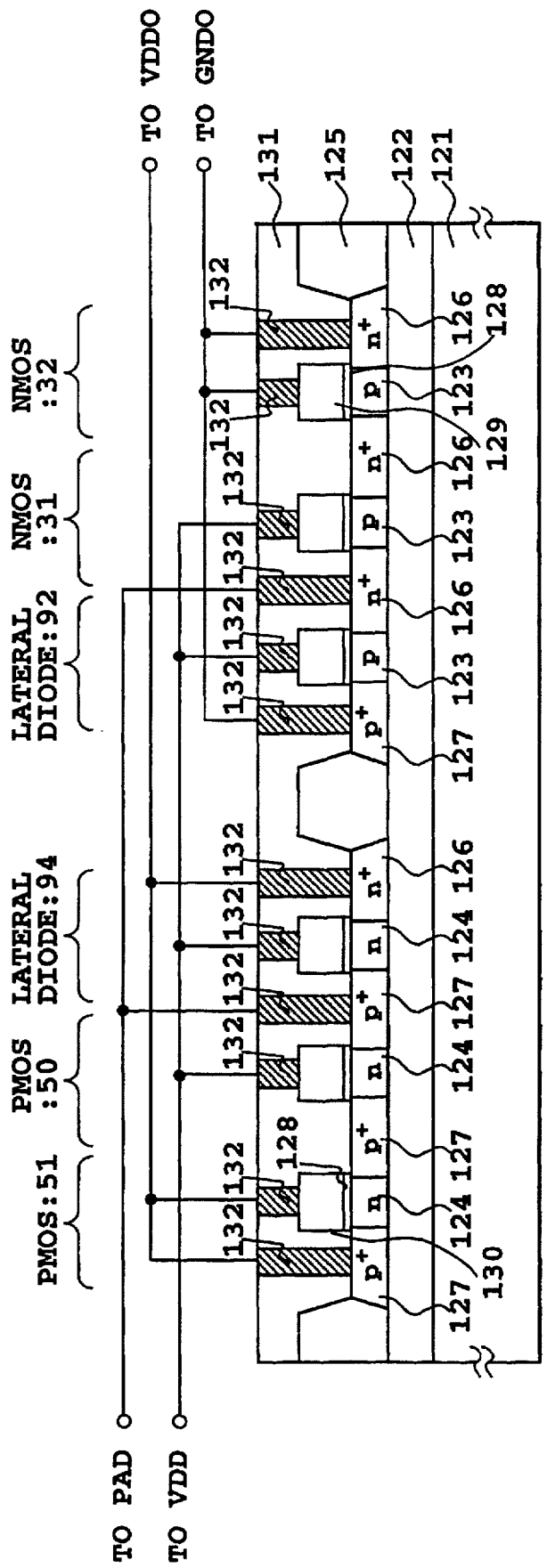
FIG. 11 is a cross-sectional view showing the output portion of the structure of the third embodiment in the form of a SOI CMOS.

FIG. 11 is a cross-sectional view showing the surge protection circuit 30B and 50B, and the lateral diodes 92 and 94 of the third embodiment implemented by a SOI CMOS.

In this figure, the reference numeral 121 designates a substrate, 122 designates a buried oxide, 123 designates P-type silicon layers, 124 designates N-type silicon layers, 125 designates field oxides, 126 designates N+diffusion layers, 127 designates P+ diffusion layers, 128 designates gate oxides, 129 designates N-type polysilicon gates, 130 designates P-type polysilicon gates, 131 designates an isolation layer, and 132 designates vias.

As shown in this figure, the entire elements are formed on the buried oxide 122. The surge protection circuit 30B and the lateral diode 92 are formed on a first active silicon region 133, and the surge protection circuit 50B and the lateral diode 94 are formed on a second active silicon region 134.

Since the surge current flows through only a part of the active silicon regions 133 and 134 in one direction at a time, only those devices located at that part are heated. Then the heat diffuses across the active silicon regions 133 and 134 to non-heated portions, and then radiates through multiple vias disposed on the regions. This makes it possible to improve the ESD protection performance as compared with the conventional circuit in which the individual devices are separated.

The source region of the NMOSFET 31 shares the N+ diffusion layer 126 with the drain region of the NMOSFET 32, and the drain region of the NMOSFET 31 shares the other N+ diffusion layer 126 with the N+ region of the lateral diode 92. Likewise, the source region of the PMOSFET 52 shares the P+diffusion layer 127 with the drain of the PMOSFET 51, and the drain region of the PMOSFET 52 shares the other P+ region 127 with the P+ region of the lateral diode 94. This makes it possible to obviate diffusion regions and separation regions for individual elements, thereby reducing the size of the circuit of this embodiment as compared with a circuit in which the individual elements are separated apart.

The polysilicon gates 129 and 130 are provided on the pn-junctions of the lateral diodes 92 and 94 to prevent diffusion of impurities into the P– and N– layers of the diodes 92 and 94 from the isolation layer 131.

The surge protection circuit 30A and the lateral diode 91 at the input side are formed in the same fashion as the corresponding elements 30B and 92 of FIG. 11, and the surge protection circuit 50A at the input side is arranged similar to the corresponding surge protection circuit 50B of FIG. 11 except for the diode 94.

EMBODIMENT 4

Figure 12:
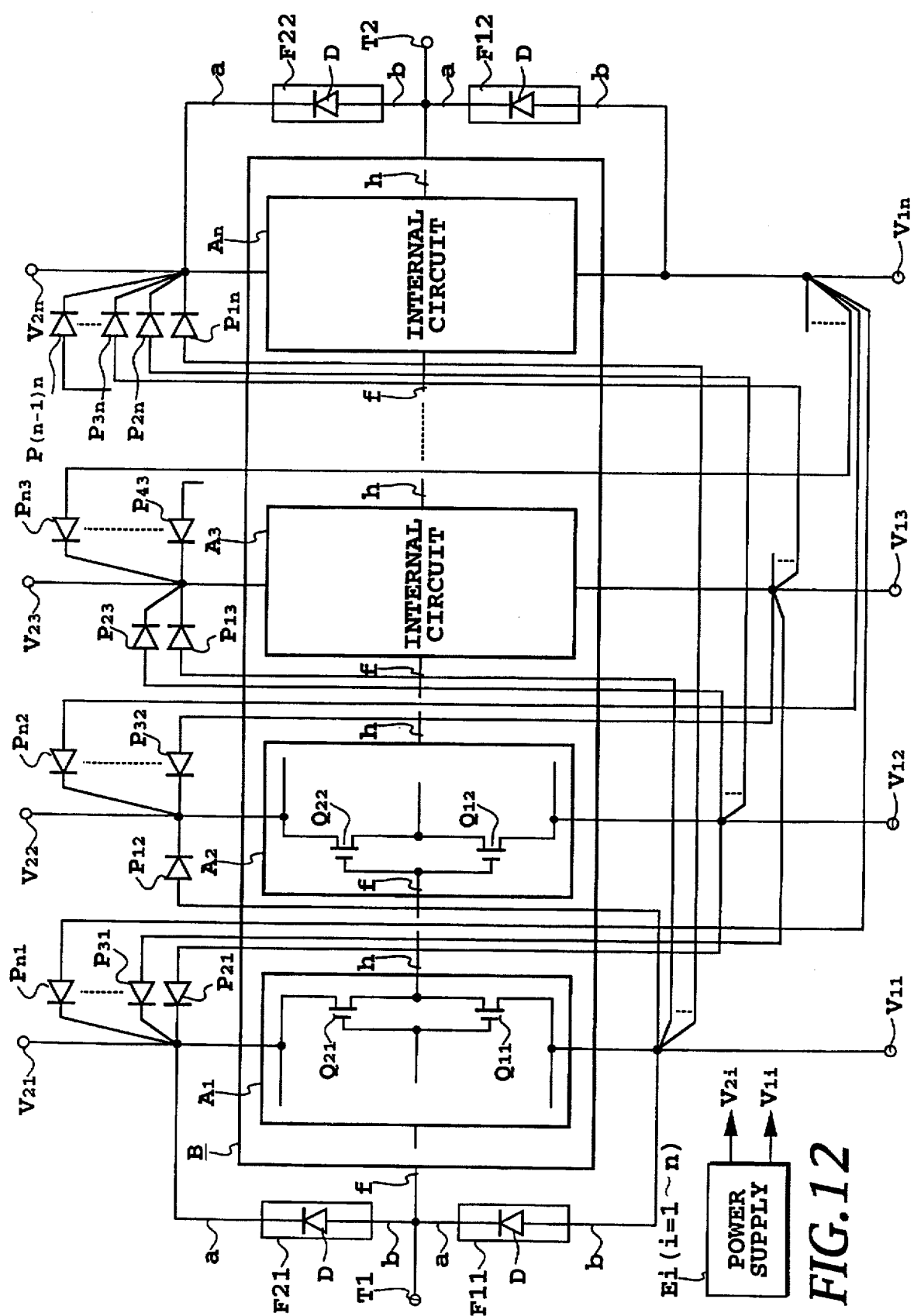
FIG. 12 is a block diagram showing a fourth embodiment of the semiconductor IC device with the ESD protection circuit in accordance with the present invention.

FIG. 12 is a block diagram showing a fourth embodiment of the semiconductor IC device in accordance with the present invention. This embodiment is a generalized version of the third embodiment.

In this figure, an input signal input to a signal input terminal Ti is supplied to n semiconductor circuits Ai (i=1, 2, ... n) each having a signal input line f and a signal output line h. The semiconductor circuit Ai includes MOSFETs Q11, Q21, Q12, Q22, ..., and the signal input lines f and signal output lines h are connected in accordance with the circuit design, thereby constituting a semiconductor IC device. The output of the semiconductor IC device is produced from a signal output terminal T2. In addition, each semiconductor circuit Ai has a pair of power supply terminals $V_{1i}$ and $V_{2i}$, to which the power supply voltages are supplied.

Furthermore, surge protection circuits or surge protection devices are connected across respective terminals. First, an input surge protection circuit F11 is connected between the signal input terminal T1 and the power supply terminal $V_{11}$, and an input surge protection circuit F21 is connected between the signal input terminal T1 and the power supply terminal $V_{21}$. On the other hand, an output surge protection circuit F12 is connected between the signal output terminal T2 and the power supply terminal $V_{1n}$, and an output surge protection circuit F22 is connected between the signal output terminal T2 and the power supply terminal $V_{2n}$.

Besides, surge protection devices $P_{ik}$ (k=1–n, and k≠i) are connected between the power supply terminal $V_{1i}$ and the power supply terminals $V_{2k}$ excluding $V_{2i}$. These surge protection devices $P_{ik}$ conduct the forward current when they are forward biased by the surge, or clamp the surge voltage to their reverse breakdown voltage when they are reverse biased by the surges, thereby protecting the semiconductor circuits Ai and Ak.

The surge protection circuits F11, F21, F12 and F22 are those in accordance with the present invention, and the surge protection circuits described in the foregoing embodiments can be used appropriately. In particular, a good result can be obtained when the surge protection circuit of the first embodiment is used as the surge protection circuits F11 and F12, and the surge protection circuit of the second embodiment is employed as the surge protection circuits F21 and F22. A better result will be obtained when a diode is connected in parallel with each of the surge protection circuits as described in the third embodiment.

EMBODIMENT 5

Figure 13:
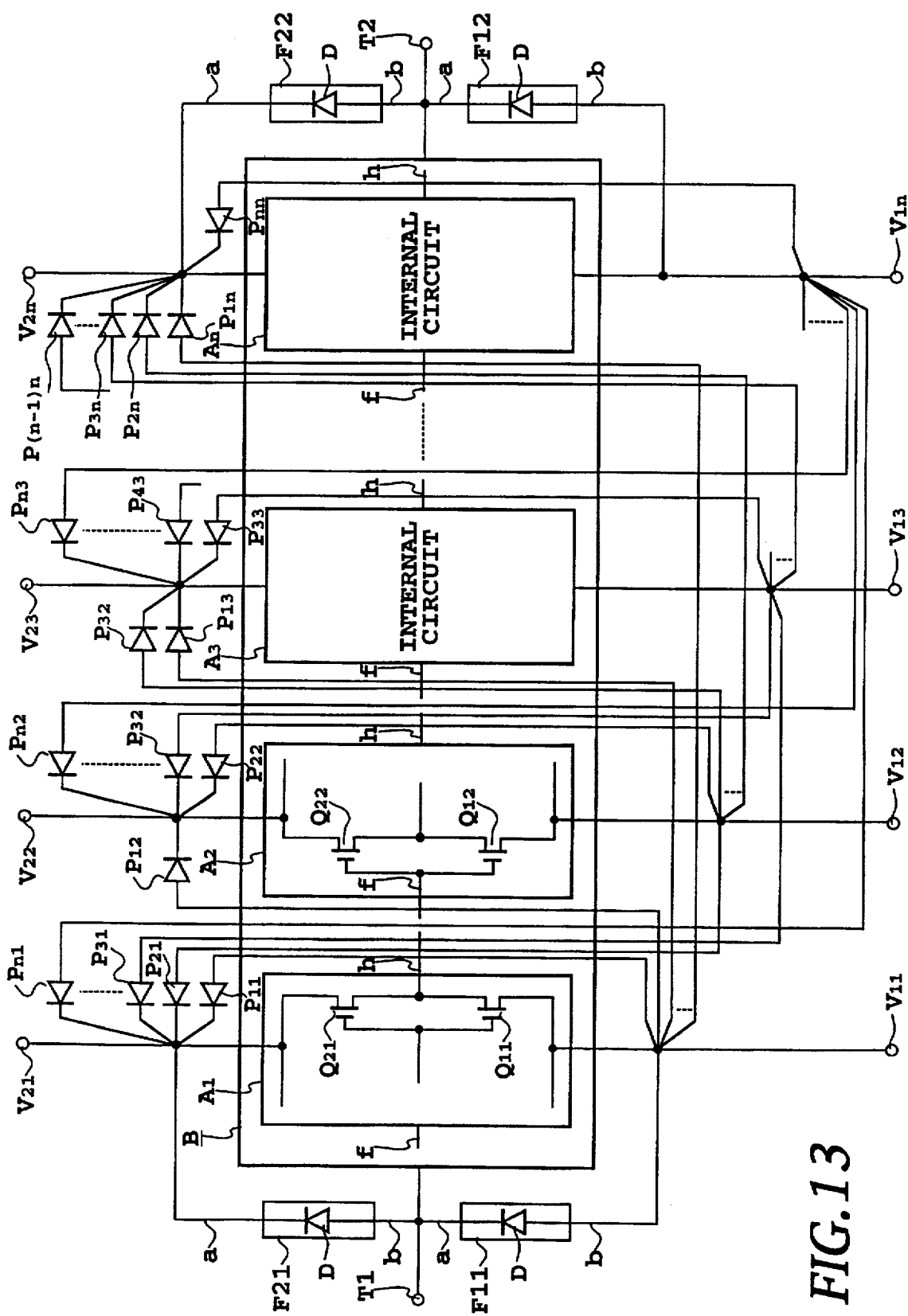
FIG. 13 is a block diagram showing a fifth embodiment of the semiconductor IC device with the ESD protection circuit in accordance with the present invention.

FIG. 13 is a block diagram showing a fifth embodiment of the semiconductor IC device in accordance with the present invention. This embodiment differs from the fourth embodiment as shown in FIG. 12 in that it is provided with surge protection devices $P_{ii}$ connected between the power supply terminals $V_{1i}$ and $V_{2i}$. The description of the operation of the semiconductor IC device is omitted here because it will be easily understood by those skilled in the art.

Finally, differences will now be described of the surge protection circuits in accordance with the present invention from the prior art.

1. Japanese patent application laying-open No. 7-335894/1995 shows, in FIGS. 2 and 7, surge protection circuits 31 and 1022 which appear to be composed of two MOSFETs connected in series. According to the description thereof, however, these MOSFETs are each connected to the input pads 23 and 1021 rather than connected in series. Thus, they distinctly differ from the surge protection circuits in accordance with the present invention.

2. Japanese patent application laying open No. 7-58324/1995 shows, in FIG. 10, two MOSFETs connected in series. The circuit, however, is a driver, in which an output line from the connecting point of the two MOSFETs is omitted. Thus, it has nothing to do with the surge protection circuit in accordance with the present invention.

The present invention has been described in detail with respect to various embodiments, and it will now be apparent from the foregoing to those skilled in the art that changes and modifications may be made without departing from the invention in its broader aspects, and it is the intention, therefore, in the appended claims to cover all such changes and modifications as fall within the true spirit of the invention.

What is claimed is:

1. A semiconductor IC device having a first semiconductor circuit, a second semiconductor circuit, a signal input terminal, a signal output terminal, power supply terminals $V_{11}$ and $V_{21}$ of the first semiconductor circuit, and power supply terminals $V_{12}$ and $V_{22}$ of the second semiconductor circuit, said semiconductor IC device comprising:

a first surge protection circuit connected between said signal input terminal and said power supply terminal $V_{11}$;

a second surge protection circuit connected between said signal input terminal and said power supply terminal $V_{21}$;

a third surge protection circuit connected between said signal output terminal and said power supply terminal $V_{12}$;

a fourth surge protection circuit connected between said signal output terminal and said power supply terminal $V_{22}$;

wherein said first surge protection circuit comprises:
a first MOSFET whose drain is connected to said signal input terminal, and whose gate is connected to said power supply terminal $V_{21}$; and
a second MOSFET whose drain is connected to a source of said first MOSFET, and whose source and gate are connected to said power supply terminal $V_{11}$;

wherein said second surge protection circuit comprises:
a third MOSFET whose source is connected to said power supply terminal $V_{21}$, and whose gate is connected to said power supply terminal $V_{22}$; and
a fourth MOSFET whose source is connected to a drain of said third MOSFET, whose drain is connected to said signal input terminal, and whose gate is connected to said power supply terminal $V_{21}$;

wherein said third surge protection circuit comprises:
a fifth MOSFET whose drain is connected to said signal output terminal, and whose gate is connected to said power supply terminal $V_{21}$; and
a sixth MOSFET whose drain is connected to a source of said fifth MOSFET, and whose source and gate are connected to said power supply terminal $V_{12}$;

and wherein said fourth surge protection circuit comprises:
a seventh MOSFET whose source and gate are connected to said power supply terminal $V_{22}$; and
an eighth MOSFET whose source is connected to a drain of said seventh MOSFET, whose drain is connected to said signal output terminal, and whose gate is connected to said power supply terminal $V_{21}$.

2. The semiconductor IC device as claimed in claim 1, wherein said semiconductor IC device is formed on a SOI LSI, in which respective elements of said semiconductor IC device are formed on a buried oxide formed on a substrate.

3. The semiconductor IC device as claimed in claim 2, further comprising surge protection devices connected between said power supply terminals $V_{12}$ and $V_{21}$, and between said power supply terminals $V_{11}$ and $V_{22}$, respectively.

4. The semiconductor IC device as claimed in claim 3, further comprising a first diode connected in parallel with said first surge protection circuit, a third diode connected in parallel with said third surge protection circuit, and a fourth diode connected in parallel with said fourth surge protection circuit.

5. The semiconductor IC device as claimed in claim 2, wherein said first MOSFET and said second MOSFET are formed on a first active silicon region formed on said buried oxide, said third MOSFET and said fourth MOSFET are formed on a second active silicon region formed on said buried oxide, said fifth MOSFET and said sixth MOSFET are formed on a third active silicon region formed on said buried oxide, and said seventh MOSFET and said eighth MOSFET are formed on a fourth active silicon region formed on said buried oxide.

6. The semiconductor IC device as claimed in claim 5, further comprising a first diode which is connected in parallel with said first surge protection circuit and formed in said first active silicon region, a third diode which is connected in parallel with said third surge protection circuit and formed in said third active silicon region, and a fourth diode which is connected in parallel with said fourth surge protection circuit and formed in said fourth active silicon region.

7. The semiconductor IC device as claimed in claim 6, wherein a source of said first MOSFET shares a first diffusion layer formed in said first active silicon region with a drain of said second MOSFET, and a drain of said first MOSFET shares a second diffusion layer formed in said first active silicon region with a diffusion layer of said first diode, a source of said fourth MOSFET shares a third diffusion layer formed in said second active silicon region with a drain of said third MOSFET, and a drain of said fourth MOSFET shares a fourth diffusion layer formed in said second active silicon region with a diffusion layer of said second diode, a source of said fifth MOSFET shares a fifth diffusion layer formed in said third active silicon region with a drain of said sixth MOSFET, and a drain of said fifth MOSFET shares a sixth diffusion layer formed in said third active silicon region with a diffusion layer of said third diode, a source of said eighth MOSFET shares a seventh diffusion layer formed in said fourth active silicon region with a drain of said seventh MOSFET, and a drain of said eighth MOSFET shares an eighth diffusion layer formed in said fourth active silicon region with a diffusion layer of said fourth diode.

8. A surge protection circuit for a semiconductor IC device including a high potential power supply terminal VDD, a low potential power supply terminal GND, a semiconductor circuit connected between the power supply terminals VDD and GND, a signal input terminal of the semiconductor circuit, and a signal output terminal of the semiconductor circuit, said surge protection circuit comprising:

a first MOSFET whose drain is connected to said signal input terminal, and whose gate is connected directly to said power supply terminal VDD; and a second MOSFET whose drain is connected to a source of said first MOSFET, and whose source and gate are connected directly to said power supply terminal GND.

9. The surge protection circuit as claimed in claim 8, wherein said surge protection circuit is formed on a SOI LSI.

10. A surge protection circuit for a semiconductor IC device including a first high potential power supply terminal VDD to be connected to a first potential, a second high potential power supply terminal VDDO to be connected to a second potential higher than the first potential, a low potential power supply terminal GND to be connected to a third potential lower than the first potential, a semiconductor circuit connected between the low potential power supply terminal and at least one of the power supply terminals VDD and VDDO, a signal input terminal of the semiconductor circuit, and a signal output terminal of the semiconductor circuit, said surge protection circuit comprising:

a first MOSFET whose source is connected to said power supply terminal VDD, and whose gate is connected to said power supply terminal VDDO; and a second MOSFET whose source is connected to a drain of said first MOSFET, whose drain is connected to said input signal terminal, and whose gate is connected to said power supply terminal VDD.

11. The surge protection circuit as claimed in claim 10, wherein said surge protection circuit is formed on a SOI LSI.

12. A surge protection circuit for a semiconductor IC device including a high potential power supply terminal VDD, a low potential power supply terminal GNDO, a semiconductor circuit connected between the power supply terminals VDD and GNDO, a signal input terminal of the semiconductor circuit, and a signal output terminal of the semiconductor circuit, said surge protection circuit comprising:

a first MOSFET whose drain is connected to said signal output terminal, and whose gate is connected directly to said power supply terminal VDD; and a second MOSFET whose drain is connected to a source of said first MOSFET, and whose source and gate are connected directly to said power supply terminal GNDO.

13. The surge protection circuit as claimed in claim 12, wherein said surge protection circuit is formed on a SOI LSI.

14. A surge protection circuit for a semiconductor IC device including a first high potential power supply terminal VDD to be connected to a first potential, a second high potential power supply terminal VDDO to be connected to a second potential higher than the first potential, a low potential power supply terminal GND to be connected to a third potential lower than the first potential, a semiconductor circuit connected between the low potential power supply terminal and at least one of the power supply terminals VDD and VDDO, a signal input terminal of the semiconductor circuit, and a signal output terminal of the semiconductor circuit, said surge protection circuit comprising:

a first MOSFET whose source is connected to said power supply terminal VDD, and whose gate is connected to said power supply terminal VDDO; and a second MOSFET whose source is connected to a drain of said first MOSFET, whose drain is connected to said output signal terminal, and whose gate is connected to said power supply terminal VDD.

15. The surge protection circuit as claimed in claim 14, wherein said surge protection circuit is formed on a SOI LSI.

16. A semiconductor IC device having n semiconductor circuit $A_i$ (i=1, 2, . . . n), a signal input terminal, a signal output terminal, and power supply terminals $V_{1i}$ and $V_{2i}$ of each of the semiconductor circuits $A_i$, said semiconductor IC device comprising:

a first surge protection circuit connected between said signal input terminal and said power supply terminal $V_{11}$;

a second surge protection circuit connected between said signal input terminal and said power supply terminal $V_{21}$;

a third surge protection circuit connected between said signal output terminal and said power supply terminal $V_{1n}$;

a fourth surge protection circuit connected between said signal output terminal and said power supply terminal $V_{2n}$; and surge protection devices $P_{ik}$ connected between the power supply terminal $V_{1i}$ and power supply terminals $V_{2k}$ (k=1–n, and k≠i) other than a power supply terminal $V_{2i}$.

17. The semiconductor IC device as claimed in claim 16, further comprising surge protection devices $P_{ii}$ connected between said power supply terminals $V_{1i}$ and $V_{2i}$.

* * * * *